United States Patent
Issaq et al.

(10) Patent No.: US 7,390,726 B1
(45) Date of Patent: Jun. 24, 2008

(54) SWITCHING RATIO AND ON-STATE RESISTANCE OF AN ANTIFUSE PROGRAMMED BELOW 5 MA AND HAVING A TA OR TAN BARRIER METAL LAYER

(75) Inventors: A. Farid Issaq, Campbell, CA (US); Frank Hawley, Campbell, CA (US)

(73) Assignee: Actel Corporation, Mountain View, CA (US)

( * ) Notice: Subject to any disclaimer, the term of this patent is extended or adjusted under 35 U.S.C. 154(b) by 490 days.

(21) Appl. No.: 11/078,952

(22) Filed: Mar. 10, 2005

Related U.S. Application Data

(60) Division of application No. 10/625,490, filed on Jul. 22, 2003, which is a continuation-in-part of application No. 09/972,825, filed on Oct. 2, 2001, and a continuation-in-part of application No. 10/327,675, filed on Dec. 20, 2002, now Pat. No. 6,728,126.

(51) Int. Cl.
*H01L 21/479* (2006.01)
(52) U.S. Cl. .................. 438/467; 257/E21.592
(58) Field of Classification Search ................ 438/466, 438/467; 257/E21.592
See application file for complete search history.

(56) References Cited

U.S. PATENT DOCUMENTS

| | | | |
|---|---|---|---|
| 4,442,507 A | 4/1984 | Roesner | 365/100 |
| 4,543,594 A | 9/1985 | Mohsen et al. | 357/51 |
| 4,599,705 A | 7/1986 | Holmberg et al. | 365/163 |
| 4,823,181 A | 4/1989 | Mohsen et al. | 357/51 |
| 4,881,114 A | 11/1989 | Mohsen et al. | |
| 5,008,855 A | 4/1991 | Eltoukhy et al. | 365/96 |

(Continued)

FOREIGN PATENT DOCUMENTS

EP 0 250 078 A2 12/1987

(Continued)

OTHER PUBLICATIONS

Grill, A. et al., "Diamondlike carbon films by rf plasma-assisted chemical vapor deposition from acetylene", *IBM Journal of Research and Development*, vol. 34, No. 6, p. 849, 1990, no month.

(Continued)

*Primary Examiner*—Thao X. Le
*Assistant Examiner*—Elias Ullah
(74) *Attorney, Agent, or Firm*—Lewis and Roca, LLP

(57) ABSTRACT

A metal-to-metal antifuse is disposed between two metal interconnect layers in an integrated circuit. An insulating layer is disposed above a lower metal interconnect layer. The insulating layer includes a via formed therethrough containing a tungsten plug in electrical contact with the lower metal interconnect layer. An antifuse material layer comprising amorphous carbon is disposed above the upper surface of the tungsten plug. The antifuse material layer is disposed between adhesion-promoting layers. A layer of a barrier metal, consisting of either tantalum or tantalum nitride, is disposed over the antifuse layer to form an upper electrode of the antifuse. An oxide or tungsten hard mask provides high etch selectivity and the possibility to etch barrier metals without affecting the dielectric constant value and mechanical properties of the antifuse.

27 Claims, 13 Drawing Sheets

U.S. PATENT DOCUMENTS

| | | |
|---|---|---|
| 5,070,384 A | 12/1991 | McCollum et al. |
| 5,126,282 A | 6/1992 | Chiang et al. |
| 5,171,715 A | 12/1992 | Husher et al. |
| 5,181,096 A | 1/1993 | Forouhi ............... 257/530 |
| 5,196,724 A | 3/1993 | Gordon et al. ............ 257/530 |
| 5,272,101 A | 12/1993 | Forouhi et al. |
| 5,308,795 A | 5/1994 | Hawley et al. |
| 5,365,104 A | 11/1994 | Godinho et al. ............ 257/529 |
| 5,411,917 A | 5/1995 | Forouhi et al. ............ 437/195 |
| 5,550,400 A | 8/1996 | Takagi et al. |
| 5,576,576 A | 11/1996 | Hawley et al. ............ 257/530 |
| 5,592,016 A | 1/1997 | Go et al. ............... 257/530 |
| 5,763,898 A | 6/1998 | Forouhi et al. ............ 257/530 |
| 5,780,323 A | 7/1998 | Forouhi et al. ............ 438/131 |
| 5,789,764 A | 8/1998 | McCollum ............... 257/76 |
| 5,807,786 A | 9/1998 | Chang |
| 5,838,530 A | 11/1998 | Zhang |
| 5,965,270 A | 10/1999 | Fang et al. |
| 6,107,165 A | 8/2000 | Jain et al. ............... 438/467 |
| 6,114,714 A | 9/2000 | Gangopadhyay ............ 257/50 |
| 6,124,193 A | 9/2000 | Hawley et al. ............ 438/600 |
| 6,130,572 A | 10/2000 | Ghilardelli et al. |
| 6,259,130 B1 | 7/2001 | Wu |
| 6,316,346 B1 | 11/2001 | Gangopadhyay ............ 438/600 |
| 6,437,365 B1 | 8/2002 | Hawley et al. ............ 257/50 |
| 6,529,038 B2 | 3/2003 | Lambertson ............... 326/38 |
| 6,583,953 B1 | 6/2003 | Han et al. ............... 360/122 |
| 6,630,396 B2 | 10/2003 | Yang et al. |
| 6,674,667 B2 | 1/2004 | Forbes |
| 6,728,126 B1 | 4/2004 | Issaq et al. ............... 365/96 |
| 6,767,769 B2 | 7/2004 | Hawley et al. |
| 6,906,421 B1 | 6/2005 | Shan et al. |
| 6,965,156 B1 | 11/2005 | Hawley et al. |
| 2002/0100907 A1 | 8/2002 | Wang ............... 257/50 |
| 2003/0062596 A1 | 4/2003 | Hawley et al. |
| 2003/0205723 A1 | 11/2003 | Hawley et al. |

FOREIGN PATENT DOCUMENTS

| | | |
|---|---|---|
| EP | 0 671 767 A2 | 9/1995 |
| EP | 0 671 767 A3 | 1/1998 |
| EP | 1461824 A2 | 9/2004 |
| EP | 1721338 A2 | 11/2006 |
| GB | 1305454 A | 1/1973 |
| JP | 60-242678 A1 | 2/1985 |
| JP | 60-242678 A | 12/1985 |
| JP | 06-295991 A | 10/1994 |
| JP | 05-508571 A1 | 3/2003 |
| WO | WO 92/21154 | 11/1992 |
| WO | 2003030217 A2 | 4/2003 |
| WO | 2003030217 A3 | 4/2003 |
| WO | 2005081976 A3 | 9/2005 |

OTHER PUBLICATIONS

Liu et al., "A New Metal-to-Metal Antifuse with Amorphous Carbon", *IEEE Electron Device Letters*, vol. 19, No. 9, Sep. 1998.

"High Purity Carbon and Graphite Products", Toshiba Ceramics, [Internet] http://tocera.co.jp/en/products/semi/carbon.html, pp. 1-2, copyright 1999, printed on Oct. 9, 2003.

Co-pending U.S. Appl. No. 10/784,903, filed Feb. 20, 2004, entitled Reprogrammable Metal-to-Metal Antifuse Employing Carbon-Containing Antifuse Material.

Co-Pending U.S. Appl. No. 11/195,002, filed Aug. 1, 2005, entitled Reprogrammable Metal-to-Metal Antifuse employing Carbon-Containing Antifuse Material.

Co-Pending U.S. Appl. No. 11/210,492, filed Aug. 23, 2005, entitled Amorphous Carbon Metal-to-Matal Antifuse with Adhesion Promoting Layers.

European Supplementary Search Report issued Dec. 4, 2006 in European Patent Application No. 02776069.3. based on International Patent Application No. PCT/US02/31253 of co-pending U.S. Appl. No. 09/972,825.

SWITCHING RATIO AND ON-STATE RESISTANCE OF AN ANTIFUSE PROGRAMMED BELOW 5 MA AND HAVING A TA OR TAN BARRIER METAL LAYER

CROSS REFERENCE TO RELATED APPLICATIONS

This application is a division of U.S. patent application Ser. No. 10/625,490, filed Jul. 22, 2003, which is a continuation-in-part of co-pending U.S. patent application Ser. No. 09/972,825, filed Oct. 2, 2001 and is a continuation-in-part of U.S. patent application Ser. No. 10/327,675, filed Dec. 20, 2002, now issued as U.S. Pat. No. 6,728,126.

BACKGROUND

The present application relates to metal-to-metal antifuses fabricated using carbon-containing antifuse layers, and more particularly, to programming metal-to-metal antifuses that are fabricated using carbon-containing antifuse layers.

Metal-to-metal antifuses are well known in the art. These devices are formed above a semiconductor substrate, usually between two metal interconnect layers in an integrated circuit and comprises an antifuse material layer sandwiched between a pair of lower and upper conductive electrodes, each electrode in electrical contact with one of the two metal interconnect layers.

Numerous materials have been proposed for use as antifuse material layers in above-substrate antifuses. Such materials include amorphous silicon or an alloy thereof, poly silicon, crystalline carbon, silicon, germanium, chalcogenide elements.

The integration of copper and low –K dielectric are regarded among other materials as a promising use for reducing the resistance/capacitance delay (RC delay). To prevent copper diffusion and to help adhesion, a thin barrier layer is desirable between the antifuse material layer and the metal layer. A titanium nitride (TiN) barrier layer, presently in use with an amorphous silicon antifuse layer at a low programming current, for example below 1 milliAmp (mA), has a very high resistance and is nonlinear. For example, the resistance for an amorphous silicon antifuse layer having a TiN barrier layer for a programming current below 1 mA can be many thousands or ten thousands of ohms and may be non-linear (i.e., acting like a diode). The TiN barrier layer, used with a carbon base antifuse at low programming current (i.e., below 5 mA) when compared to a TiN barrier layer used with an amorphous silicon layer, has considerably lower resistance of about 2000 ohms at about 1.0 mA and about 300 to about 500 ohms at about 5 mA, and, in both cases, is linear.

Hence, there is a need for a barrier metal layer for an antifuse that has a low resistance at a low programming current and a good switching character ratio.

SUMMARY

A metal-to-metal antifuse is disposed between two metal interconnect layers in an integrated circuit. An insulating layer is disposed above a lower metal interconnect layer. The insulating layer includes a via formed therethrough containing a tungsten plug in electrical contact with the lower metal interconnect layer. The tungsten plug forms a lower electrode of the antifuse. The upper surface of the tungsten plug is planarized with the upper surface of the insulating layer. In a first embodiment, an antifuse layer comprising amorphous carbon is disposed above the upper surface of the tungsten plug. An adhesion-promoting layer of a material, such as SiN or SiC, may be provided at the interfaces of the antifuse layer and the other layers in the structure. A barrier metal layer disposed over the antifuse layer forms an upper electrode of the antifuse.

BRIEF DESCRIPTION OF THE FIGURES

Referring now to the figures, wherein like elements are numbered alike.

DETAILED DESCRIPTION

Those of ordinary skill in the art will realize that the following description is illustrative only and not in any way limiting. Other embodiments will readily suggest themselves to such skilled persons.

The metal-to-metal antifuses are disposed between two metal interconnect layers that lie above and are insulated from the semiconductor substrate in an integrated circuit. An insulating layer is disposed above a lower metal interconnect layer. The insulating layer includes a via formed therethrough containing a tungsten plug in electrical contact with the lower metal interconnect layer. The tungsten plug forms a lower electrode of the antifuse. The upper surface of the tungsten plug is planarized with the upper surface of the insulating layer.

Figure 1A:
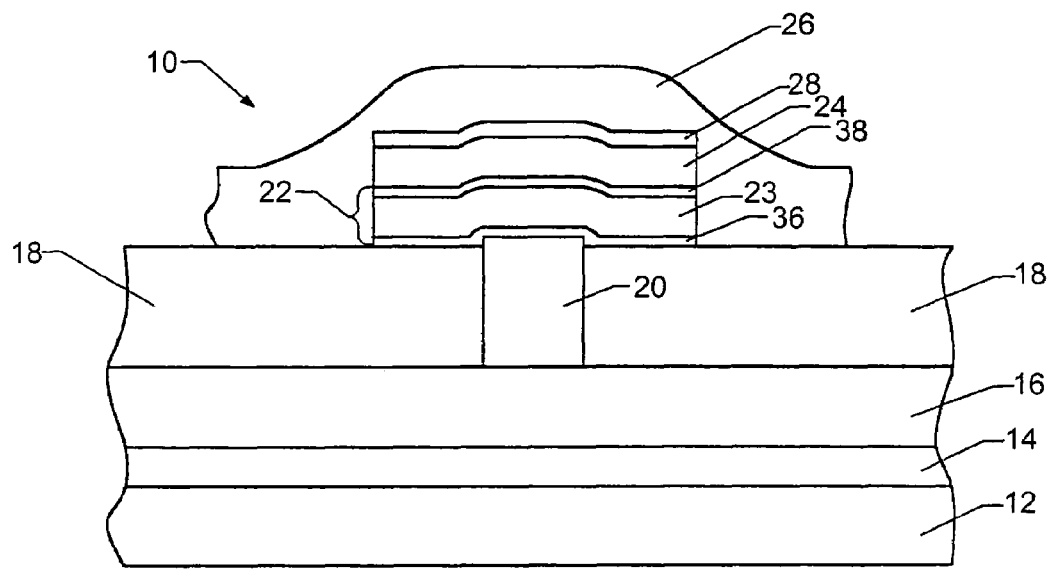
FIG. 1A is a cross-sectional view of an illustrative antifuse.

Referring first to FIG. 1A, a cross-sectional view shows an illustrative metal-to-metal antifuse structure 10. In the embodiment shown in FIG. 1, substrate 12 is shown covered by insulating layer 14 and metal interconnect layer 16. Persons of ordinary skill in the art will realize that FIG. 1A is merely illustrative and that metal interconnect layer 16 need not be the first metal interconnect layer in a multi-level metal integrated circuit.

Insulating layer 18, comprising, for example, deposited silicon dioxide having a thickness from between about 300 nanometers (nm) to about 1,000 nm, is disposed above metal interconnect layer 16 and includes a tungsten plug 20 formed in a via therethrough and electrically coupled to metal interconnect layer 16. As is known in the art, the upper surfaces of insulating layer 18 and tungsten plug 20 may be planarized to provide a relatively flat surface upon which to fabricate an antifuse. Alternatively, tungsten plug 20 may be raised above the surface of the insulating layer 18 by performing planarization using CMP techniques or by performing a plasma oxide etch after planarization.

In the embodiment of FIG. 1A, an antifuse layer 22 is disposed over tungsten plug 20. The antifuse layer 22 may comprise an antifuse material 23 selected from the group including amorphous carbon, amorphous carbon doped with hydrogen or fluorine, and amorphous silicon carbide and may have a thickness of about 0.2 nm to about 100 nm. In addition, combinations of the materials as disclosed herein may be used for the antifuse material 23. The amorphous carbon, and combinations thereof, may be disposed on the device using a source gas, preferably acetylene gas ($C_2H_2$).

For example, the antifuse material 23 may be formed from amorphous carbon or amorphous carbon doped with fluorine or hydrogen or fluorine and hydrogen having a thickness of between about 10 nm to about 80 nm. Where antifuse material 23 is formed from amorphous carbon doped with hydrogen, the hydrogen doping should be from about 1 atomic percent to about 40 atomic percent. Where antifuse material 23 is formed from amorphous carbon doped with fluorine, the fluorine doping should be from about 0.5 atomic percent to about 20 atomic percent.

Antifuse layer 22 may also be formed from a combination of layers, including adhesion layers 36, 38. A first example is a layer of silicon carbide having a thickness of about 0.4 nm, a layer of amorphous carbon having a thickness of between about 10 nm and about 80 nm, and a layer of silicon carbide having a thickness of about 0.4 nm. A second example is a layer of silicon nitride having a thickness of about 0.4 nm, a layer of amorphous carbon having a thickness of between about 10 nm and about 80 nm, and a layer of silicon nitride having a thickness of about 0.4 nm.

When the antifuse material 23 comprises amorphous carbon or doped amorphous carbon, a thin (e.g., 0.4 nm) adhesion-promoting layer of SiN or SiC is disposed below the antifuse material 23 and above the antifuse material 23 to promote adhesion between the antifuse material 23 and the adjoining layers in the antifuse structure. For purposes of this disclosure, antifuse material layers comprising amorphous carbon or doped amorphous carbon shall be construed to include such adhesion-promoting layers as a part of their structure.

A first example is a lower adhesion layer 36 of amorphous silicon carbide having a thickness of about 0.4 nm, a middle layer 23 of amorphous carbon having a thickness of between about 10 nm and about 80 nm, and an upper adhesion layer 38 of amorphous silicon carbide having a thickness of about 0.4 nm. A second example is a lower adhesion layer 36 of amorphous silicon nitride having a thickness of about 0.4 nm, a middle layer 23 of amorphous carbon having a thickness of between about 10 nm and about 80 nm, and an upper adhesion layer 38 of amorphous silicon nitride having a thickness of about 0.4 nm.

A barrier metal layer 24 such as Ta, TaN, TaC, Ti, TiC, or TiN having a thickness of about 10 nm to about 200 nm is disposed over the antifuse material layer forming an upper electrode of the antifuse. In a second embodiment to be disclosed herein, an additional lower barrier metal layer is disposed between the top surface of the tungsten plug and the antifuse material 23. In the embodiment illustrated in FIG. 1A, a hard mask layer 28 is deposited over the barrier metal layer 24. The hard mask layer 28 may be comprised of, for example, an oxide such as silicon oxide, a metal such as tungsten, or another suitable material known in the art.

Figure 1B:
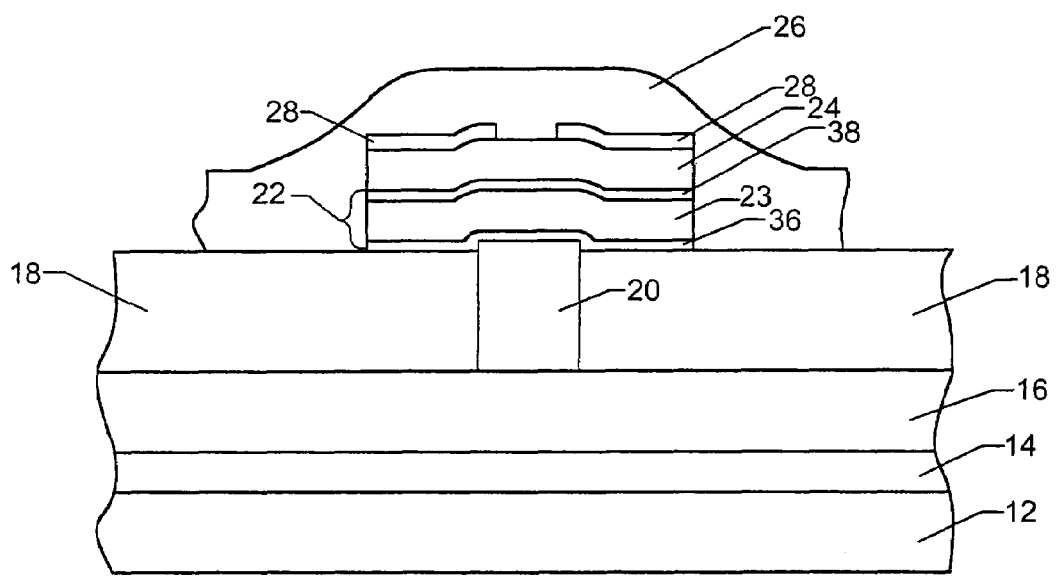
FIG. 1B is a cross-sectional view of another illustrative antifuse.

The embodiment shown in FIG. 1B is similar to the embodiment shown in FIG. 1A, except that the hard mask layer 28 in FIG. 1B is comprised of an insulator such as silicon dioxide, and has been etched to include a via through which electrical contact to a metal layer may be made.

Figure 2A:
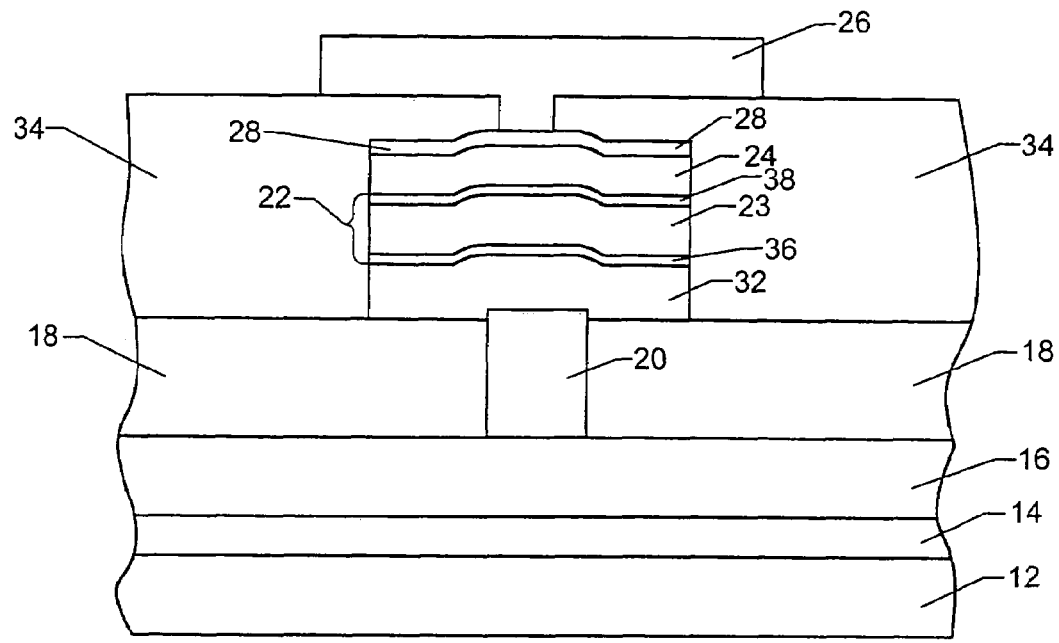
FIG. 2A is a cross-sectional view of another illustrative antifuse.
Figure 2B:
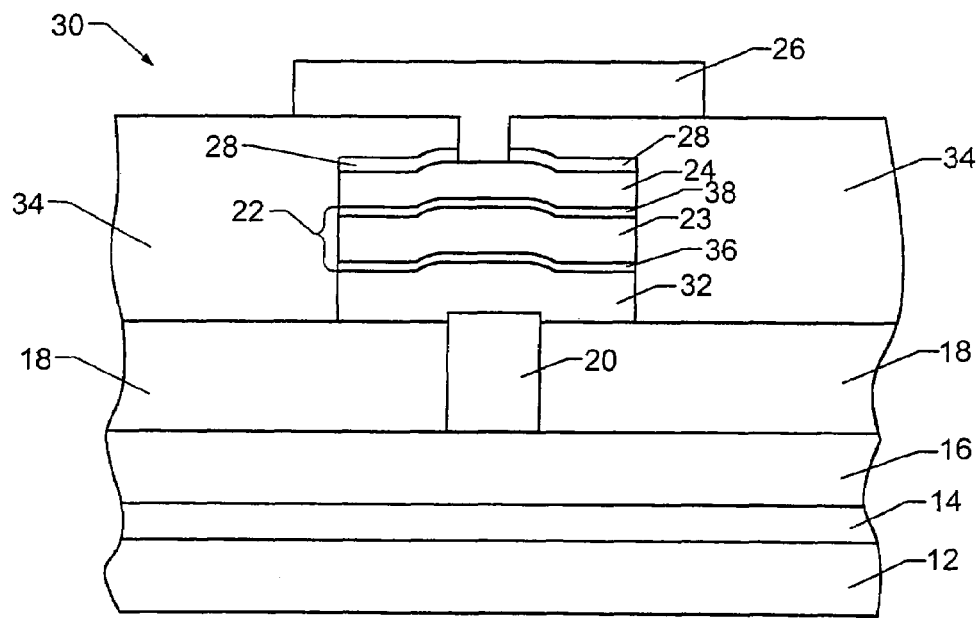
FIG. 2B is a cross-sectional view of another illustrative antifuse.

Referring now to FIG. 2B, a cross-sectional view shows an illustrative metal-to-metal antifuse 30. The embodiment illustrated in FIG. 2B is similar to the embodiments illustrated in FIGS. 1A and 1B, and structures in FIGS. 1A through 1B. 2B corresponding to structures in FIGS. 1A through 1B will be identified by the same reference numerals. Also, unless otherwise noted, persons of ordinary skill in the art will appreciate that the materials and thicknesses of the various layers will be similar to those disclosed with respect to the embodiment of FIGS. 1A through B.

In the embodiment shown in FIG. 2B, substrate 12 is shown covered by insulating layer 14 and metal interconnect layer 16. As was the case with the embodiments illustrated in FIGS. 1A through 1B, persons of ordinary skill in the art will realize that FIG. 2B is merely illustrative and that metal interconnect layer 16 need not be the first metal interconnect layer in a multi-level metal integrated circuit.

Insulating layer 18, comprising, for example, deposited silicon dioxide, is disposed above metal interconnect layer 16 and includes a tungsten plug 20 formed in a via therethrough and electrically coupled to metal interconnect layer 16. As is known in the art, the upper surfaces of insulating layer 18 and tungsten plug 20 may be planarized to provide a relatively flat surface upon which to fabricate antifuse 30. Alternatively, tungsten plug 20 may be raised above the surface of the insulating layer 18 by performing planarization using CMP techniques or by performing a plasma oxide etch after planarization.

As previously mentioned, the embodiment of the invention of FIG. 2B includes an additional barrier metal layer 32 disposed between the top surface of the tungsten plug and the antifuse layer 22. Additional barrier metal layer 32 comprises a material such as Ta, TaN, TaC, Ti, TiC, or TiN and has a thickness of about 25 nm to about 200 nm. In some embodiments, a thin layer of Ti is deposited, at a thickness of about 10 nm to about 40 nm, on the surface to which the barrier metal layer 32 is to be deposited (e.g., insulating layer 18 and tungsten plug 20). Antifuse layer 22 is the same as that disclosed with respect to the embodiments of FIGS. 1A through 1B.

A barrier metal layer 24 comprising a material such as Ta, TaN, TaC, Ti, TiC, or TiN and having a thickness of about 25 nm to about 200 nm is disposed over the antifuse layer 22 forming an upper electrode of the antifuse 30 of FIG. 2B. In some embodiments, a thin layer of Ti is deposited, at a thickness of about 10 nm to about 40 nm, on the surface to which the barrier metal layer 24 is to be deposited (e.g., antifuse layer 22). In the embodiment illustrated in FIG. 2B, a hard mask layer 28 is shown as an oxide layer deposited over the barrier metal layer 24. During processing, a layer of photoresist is deposited on the oxide layer and then the oxide layer is etched. Following etching, the photoresist is stripped and the remaining oxide layer is left as a hard mask, acting as an etch mask when etching the barrier metal layer 24 and the antifuse layer 22. The hard mask layer 28 protects the antifuse layer 22 from being removed during the photoresist stripping step.

FIG. 2A shows an antifuse device similar to the device shown in FIG. 2B, where a metal layer such as tungsten comprises the hard mask 28. Since Al, Ti, Ta, TaC, TiC, TaN, and TiN have high selectivity to tungsten (W), a thin layer of PVD or CVD tungsten (about 25 nm to about 50 nm) can also be used as a hard mask 28 to etch the underlying metal 24. Since the tungsten layer is thin, only a thin layer of photoresist is required to pattern hard mask 28. Once the hard mask 28 is etched open, the remaining photoresist is stripped and metal layer 24 can be etched without organic material present on the metal stack. Once the metal layer 24 is etched, the tungsten hard mask can be etched in reactive ion etch (RIE) with an SF6 chemistry. It is also possible to leave the thin tungsten hard mask layer 28 above the etched metal stack, as shown in FIG. 2A. The use of an oxide or tungsten hard mask provides high etch selectivity and the possibility to etch metals without affecting the dielectric constant value (K) and mechanical properties of the amorphous carbon antifuse layer 22.

Another difference between the embodiments of FIGS. 1A through 1B and 2A through 2B is that an additional insulating layer 34, that may comprise a deposited layer of silicon dioxide having a thickness of about 100 nm to about 500 nm may be employed over the structure including barrier metal layer 32, antifuse layer 22, and barrier metal layer 24, as shown in FIGS. 2A through 2B. Metal interconnect layer 26 is disposed over the insulating layer 34 and contacts barrier metal layer 24 through a via formed the insulating layer 34.

Figure 3A:
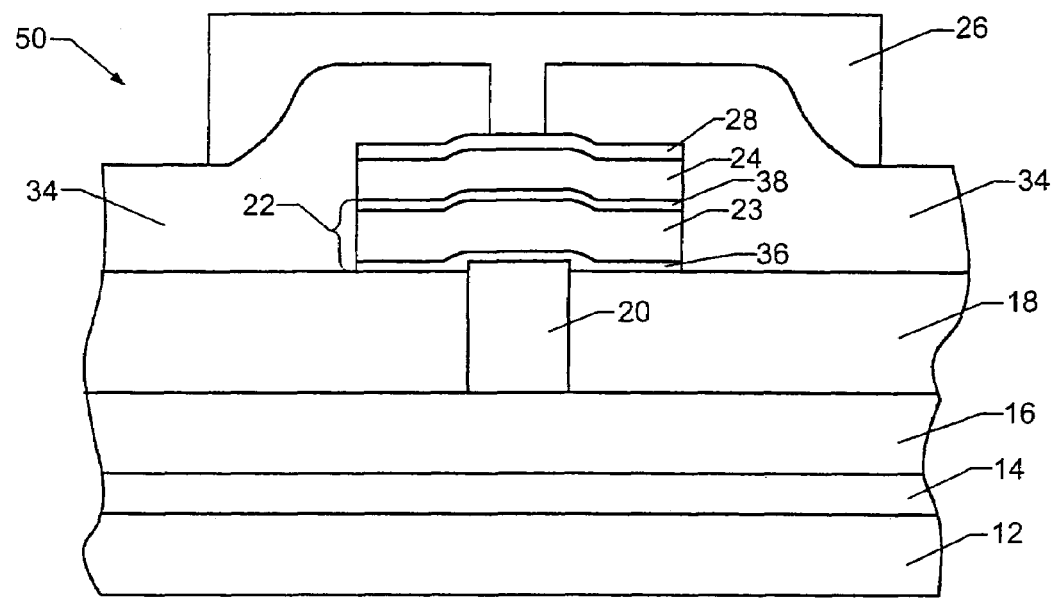
FIG. 3A is a cross-sectional view of another illustrative antifuse.

Referring now to FIG. 3A, a cross-sectional view shows an illustrative metal-to-metal antifuse 50. The embodiment illustrated in FIG. 3A is similar to the embodiment illustrated in FIG. 1A, and structures in the embodiment of FIG. 3A corresponding to structures in FIG. 1A will be identified by the same reference numerals. Also, unless otherwise noted, persons of ordinary skill in the art will appreciate that the materials and thicknesses of the various layers will be similar to those disclosed with respect to the embodiment of FIG. 1A.

In the embodiment shown in FIG. 3A, substrate 12 is shown covered by insulating layer 14 and metal interconnect layer 16. As was the case with the embodiment illustrated in FIG. 1A, persons of ordinary skill in the art will realize that FIG. 3A is merely illustrative and that metal interconnect layer 16 need not be the first metal interconnect layer in a multi-level metal integrated circuit.

Insulating layer 18, comprising, for example, deposited silicon dioxide, is disposed above metal interconnect layer 16 and includes a tungsten plug 20 formed in a via therethrough and electrically coupled to metal interconnect layer 16. As is known in the art, the upper surfaces of insulating layer 18 and tungsten plug 20 may be planarized to provide a relatively flat surface upon which to fabricate antifuse 50. Alternatively, tungsten plug 20 may be raised above the surface of the insulating layer 18 by performing planarization using CMP techniques or by performing a plasma oxide etch after planarization.

As previously mentioned, an antifuse layer 22 is disposed over tungsten plug 20. Antifuse layer 22 is the same as that disclosed with respect to the embodiment of FIG. 1A. A barrier metal layer 24 such as Ta, TaN, TaC, Ti, TiC, or TiN having a thickness of about 25 nm to about 200 nm is disposed over the antifuse material layer forming an upper electrode of the antifuse 50 of FIG. 3A. In the embodiment illustrated in FIG. 3A, an oxide layer 28 is deposited over the barrier metal layer 24. In some embodiments, a tungsten layer can also be utilized for layer 28.

A difference between the embodiments of FIGS. 1A and 3A is that an additional insulating layer 34, that may comprise a deposited layer of silicon nitride or silicon oxide (using PECVD techniques) having a thickness of about 50 nm to about 500 nm, with about 100 nm preferred, may be employed over the structure including antifuse layer 22 and barrier metal layer 24, as shown in FIG. 3A. This material protects antifuse layer 22 from shorting with the metal interconnect layer 26. Metal interconnect layer 26 is disposed over the insulating layer 34 and contacts the antifuse stack through a via formed through insulating layer 34.

Figure 3B:
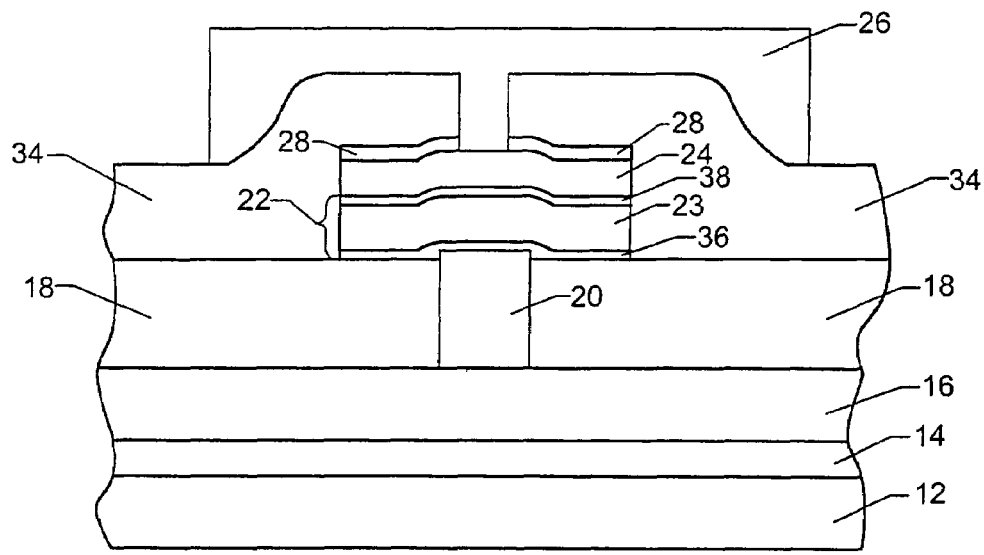
FIG. 3B is a cross-sectional view of another illustrative antifuse.

In the embodiment shown in FIG. 3B, the hard mask layer 28 is comprised of an insulator such as silicon dioxide, and has been etched to include a via through which electrical contact to a metal layer may be made.

Figure 4A:
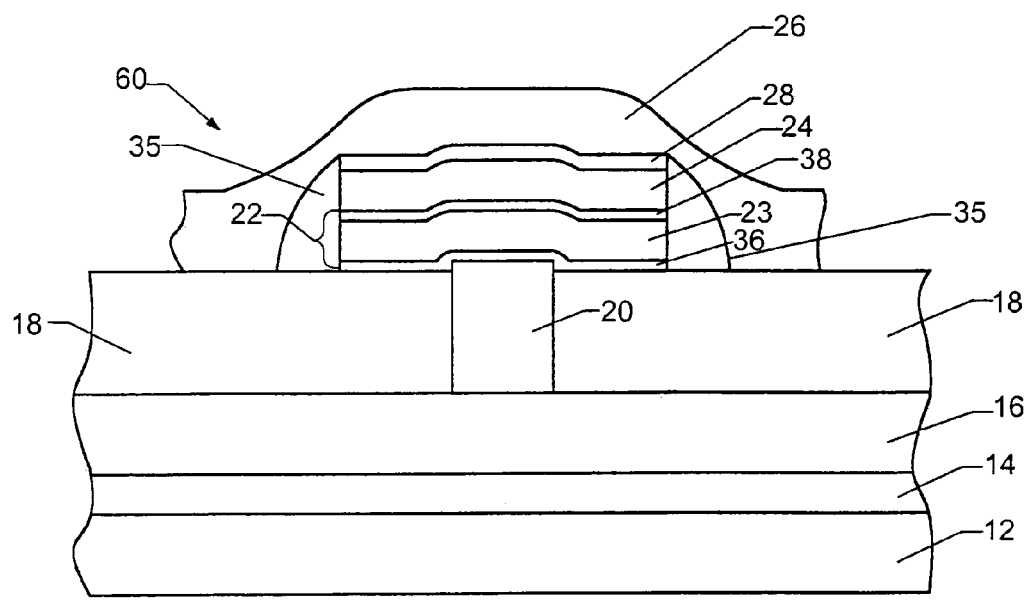
FIG. 4A is a cross-sectional view of another illustrative antifuse.

Referring now to FIG. 4A, a cross-sectional view shows an illustrative metal-to-metal antifuse 60. The embodiment illustrated in FIG. 4A is similar to the embodiment illustrated in FIG. 1A, and structures in the embodiment of FIG. 4A corresponding to structures in FIG. 1A will be identified by the same reference numerals. Also, unless otherwise noted, persons of ordinary skill in the art will appreciate that the materials and thicknesses of the various layers will be similar to those disclosed with respect to the embodiment of FIG. 1A.

A difference between the embodiments of FIGS. 1A and 4A is that an additional insulating layer or spacer 35, that may comprise a deposited layer of silicon nitride or silicon oxide (using PECVD techniques) having a thickness of about 50 nm to about 200 nm, with about 100 nm preferred, may be employed adjacent to the structure including antifuse layer 22 and barrier metal layer 24, as shown in FIG. 4A. This material protects antifuse layer 22 from shorting with the metal interconnect layer 26.

Figure 4B:
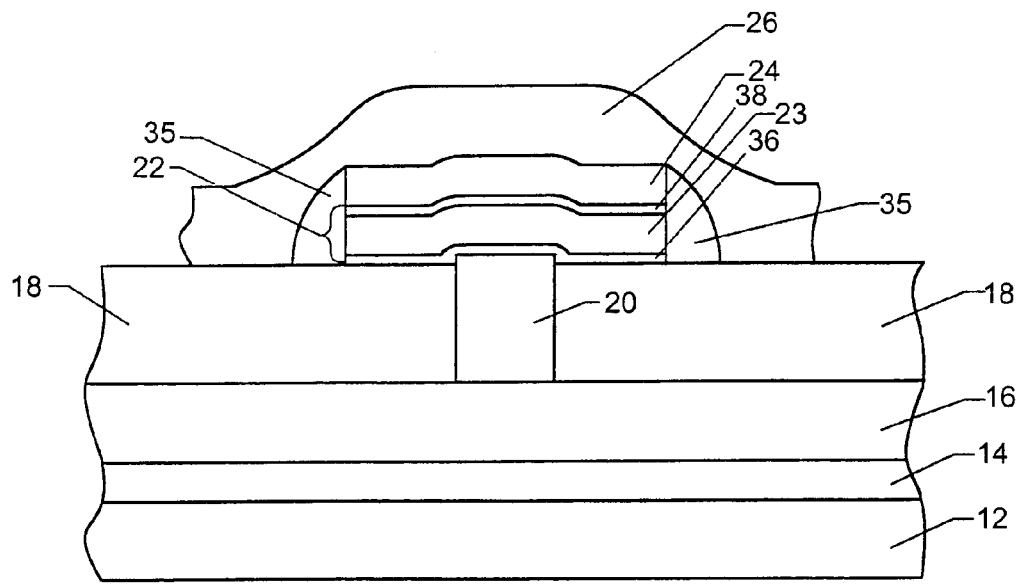
FIG. 4B is a cross-sectional view of another illustrative antifuse.

A difference between the embodiments shown in FIG. 4A and FIG. 4B is that FIG. 4B shows an embodiment where an insulating hard mask layer was used. The hard mask layer was removed prior to the disposing of metal interconnect layer 26 over the antifuse stack. Metal interconnect layer 26 is disposed over the spacer 35 and contacts barrier metal layer 24, as illustrated in FIG. 4B. FIG. 4A shows an embodiment with a conducting hard mask layer 28 (e.g., comprised of tungsten). In this embodiment, the hard mask 28 does not need to be removed.

Figure 5A:
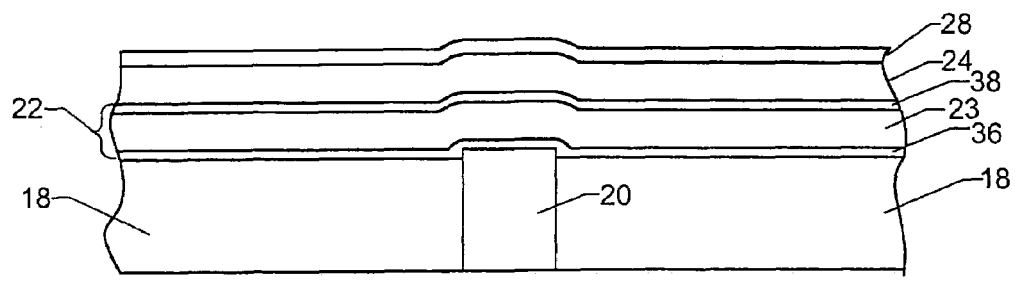
FIGS. 5A through 5C are cross-sectional views of the antifuse of FIG. 1A and FIG. 1B showing the structure existing at selected points in the fabrication process.
Figure 5B:
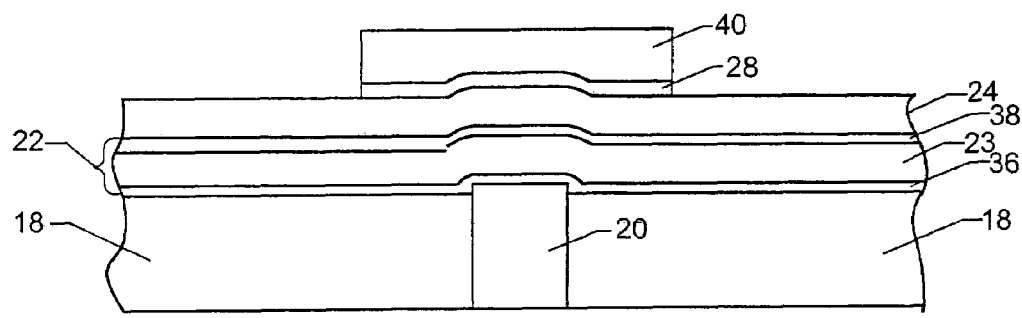
Figure 5C:
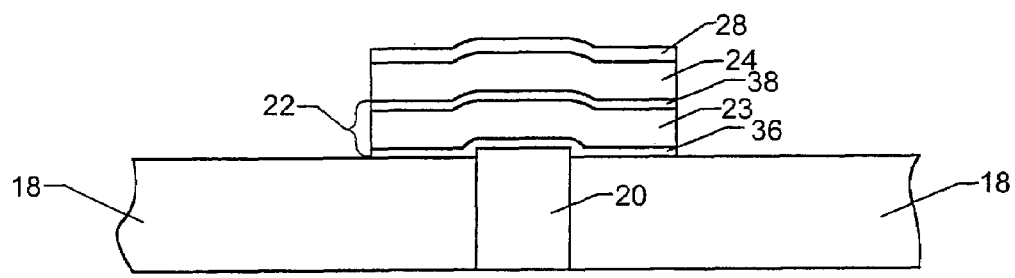

FIGS. 5A through 5C are cross-sectional views of the antifuse of FIG. 1A showing the structure existing at selected points in the fabrication process. Since the fabrication of antifuse 10 begins after the planarization of the insulating layer 18 and tungsten plug 20 that follows well-known prior processing steps, all of FIGS. 5A through 5C show the insulating layer 18 and tungsten plug 20 as the starting point for the fabrication process.

Referring first to FIG. 5A, antifuse 10 of FIG. 1A is fabricated by forming antifuse layer 22 over tungsten plug 20 and insulating layer 18. As previously noted, antifuse layer 22 may include thin adhesion-promoting material layers 36, 38, such as SiN or SiC deposited, for example, using PECVD techniques.

As will be appreciated by persons of ordinary skill in the art, the thickness of antifuse material 23 is usually from about 10 nm to about 80 nm. Such skilled persons will realize that the thickness used will depend on the desired programming voltage for the finished antifuse.

Next, barrier metal layer 24 is deposited to a thickness of about 25 nm to about 200 nm using PVD sputtering techniques. A hard mask layer 28 is deposited over the barrier metal layer 24. The hard mask layer 28 is deposited at about 500 angstroms to about 4,000 angstroms, with about 2,000 angstroms preferred. The hard mask layer 28 can comprise either oxide or tungsten.

Referring now to FIG. 5B, a layer of photoresist 40 is deposited on the hard mask layer 28 and then photoresist 40 and hard mask layer 28 are etched. Following etching, the photoresist 40 is stripped and the hard mask layer acts as an etch mask when etching the barrier metal layer 24 and the antifuse layer 22. Since Al, Ti, TiC, Ta, TaC, TaN, and TiN have high selectivity to tungsten (W), a thin layer of PVD or CVD tungsten (about 25 nm to about 50 nm) can be used as the hard mask 28. A tungsten hard mask layer 28 can be deposited at about 250 angstroms to about 4,000 angstroms, with about 500 angstroms preferred. Once the metal layer 24 is etched, the tungsten hard mask can be etched. It is also possible to leave the thin tungsten layer above the etched metal stack. The oxide or tungsten hard mask provides high etch selectivity and the possibility to etch metals without affecting the dielectric constant value (K) and mechanical properties of the amorphous carbon antifuse material 23.

As shown in FIG. 5B, after antifuse material 23, any necessary adhesion layers, and barrier metal layer 24 and hard mask 28 have been formed, a photoresist layer 40 is formed over the surface of hard mask layer 28 to define the shape of the antifuse "stack" comprising layers 36, 22, 38, 24, and 28. A conventional etching step is then performed to etch the hard mask 28 to the desired geometry. FIG. 5B depicts the structure remaining after the etching step used to define the shape of the hard mask but prior to removal of the photoresist layer 40.

A layer of photoresist is deposited on the hard mask layer 28 and then the hard mask layer 28 is etched. Following etching, the photoresist is stripped and the remaining hard mask layer is left as a hard mask, acting as an etch mask when etching the barrier metal layer 24 and the antifuse layer 22. The hard mask layer 28 protects the antifuse layer 22 from being removed during the photoresist stripping step. Since Al, Ti, Ta, TaN, and TiN have high selectivity to tungsten (W), a thin layer of PVD tungsten (about 25 nm to about 50 nm) can also be used as a hard mask 28 to etch the underlying metal 24. Since the tungsten layer is thin, only a thin layer of photoresist is required to pattern the hard mask. Once the hard mask is open, the remaining photoresist is stripped and metal layer 24 can be etched without organic material present on the metal stack. Once the metal layer 24 is etched, the tungsten hard mask can be etched in RIE with an SF6 chemistry. It is also possible to leave the thin tungsten layer above the etched metal stack. The oxide or tungsten hard mask provides high etch selectivity and the possibility to etch metals without affecting the dielectric constant value (K) and mechanical properties of the amorphous carbon antifuse layer 22.

Following removal of the photoresist 40, the device is etched using hard mask 28 to define the antifuse stack. Referring now to FIG. 5C, the antifuse stack following etching is shown. FIGS. 1A and 1B depict the antifuse structure of FIG. 5C after performance of further processing steps.

Figure 6A:
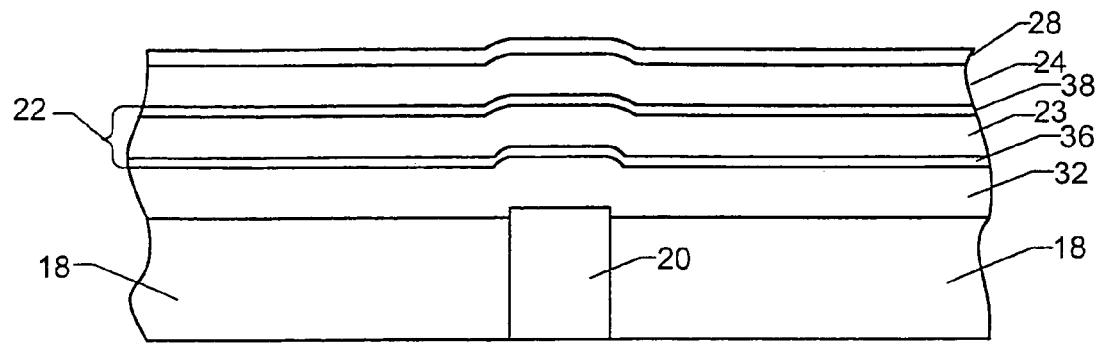
FIGS. 6A through 6C are cross-sectional views of the antifuse of FIG. 2A and FIG. 2B showing the structure existing at selected points in the fabrication process.
Figure 6B:
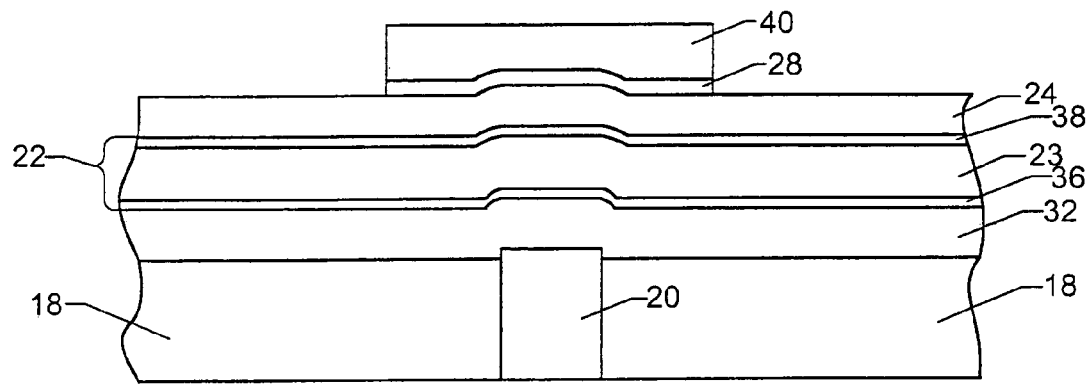
Figure 6C:
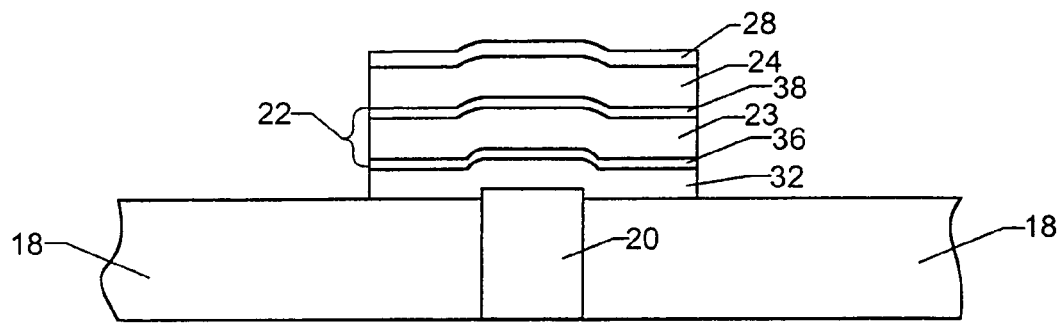

Referring now to FIGS. 6A through 6C, cross-sectional views show the structure of the antifuse 30 of FIGS. 2A and 2B existing at selected points in the fabrication process. The results of the processing steps are analogous to those shown in FIGS. 5A-5C, but for a device such as shown in FIGS. 2A and 2B. Referring to FIG. 6A, antifuse 30 of FIGS. 1A and 1B is fabricated by depositing barrier metal layer 32 over tungsten plug 20 and insulating layer 18. FIGS. 2A and 2B depict the structure of antifuse 30 in FIG. 6C after performance of additional processing steps.

Figure 7A:
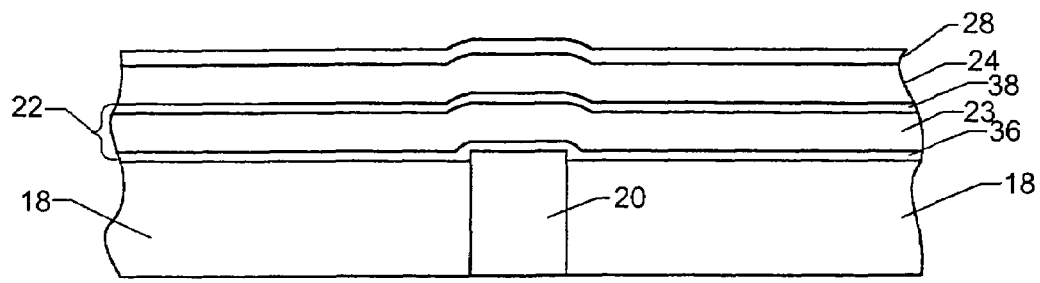
FIGS. 7A through 7C are cross-sectional views of the antifuse of FIG. 3A and FIG. 3B showing the structure existing at selected points in the fabrication process.
Figure 7B:
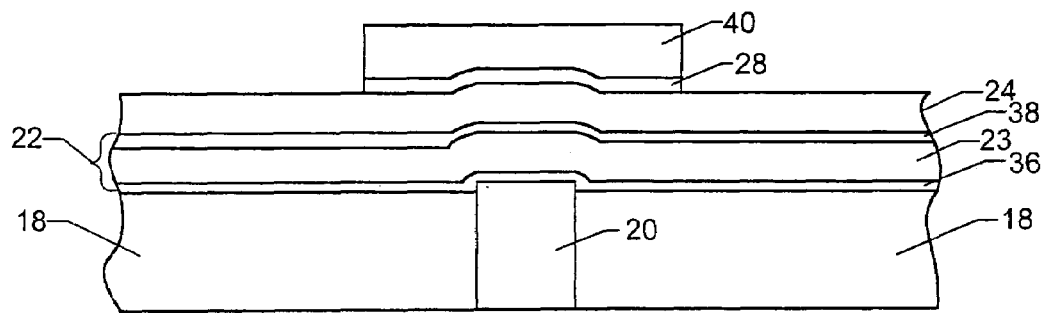
Figure 7C:
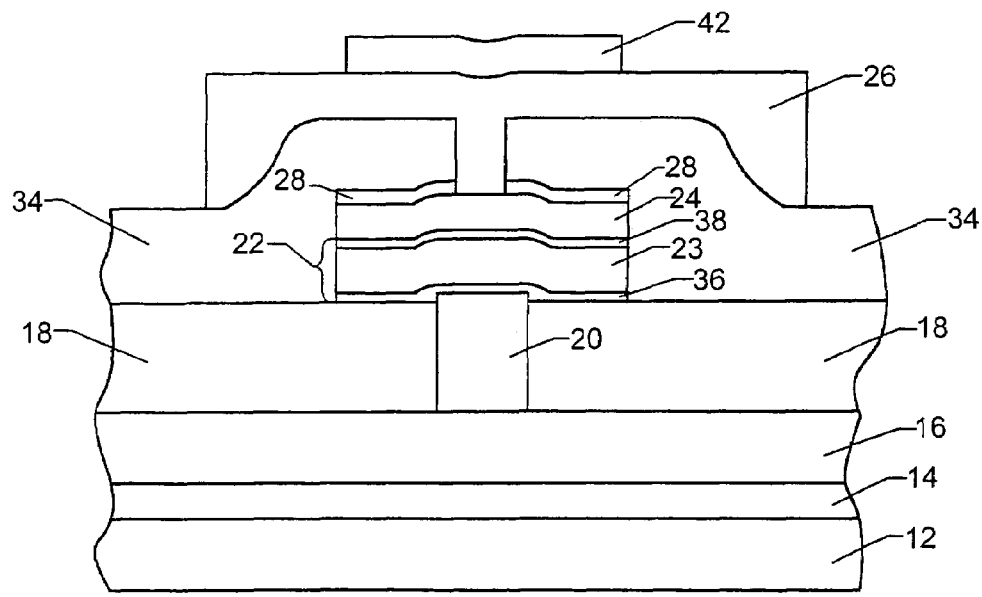

Referring now to FIGS. 7A through 7C, cross-sectional views show the structure of the antifuse 50 of FIGS. 3A and 3B existing at selected points in the fabrication process. The results of the processing steps are analogous to those shown in FIGS. 5A through 5C, but for a device such as shown in FIGS. 3A and 3B.

Referring now specifically to FIG. 7C, photoresist 40 has been removed using conventional mask-stripping steps and layers 24 through 36 have been etched and an insulating layer 34 has been deposited over the layers 36, 22, 38, and 24 comprising the antifuse stack and the exposed surface of the insulating layer 18. Conventional masking and etching techniques (not shown) are then employed to form a contact via in insulating layer 34 and in hard mask 28 (in the case of an oxide hard mask). Next, metal interconnect layer 26 is deposited over insulating layer 34 and in the contact via where it is electrically connected to barrier metal layer 24. A masking layer 42 may be formed over metal interconnect layer 26 using conventional photolithographic techniques in preparation for a metal-etch step to define the geometry of metal interconnect layer 26. FIG. 3B depicts the structure of antifuse 50 in FIG. 7C after performance of further processing steps.

Figure 8A:
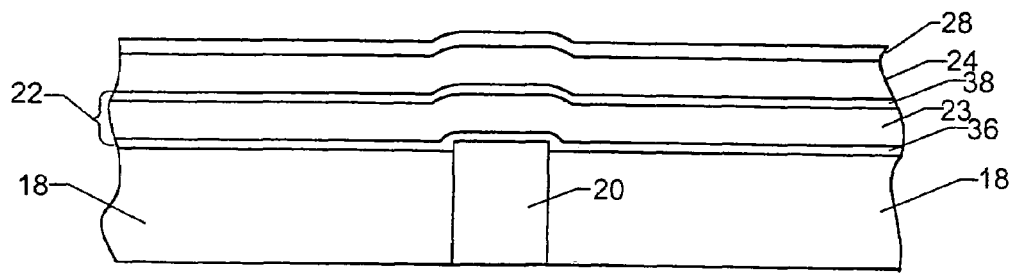
FIGS. 8A through 8C are cross-sectional views of the antifuse of FIG. 4A and FIG. 4B showing the structure existing at selected points in the fabrication process.
Figure 8B:
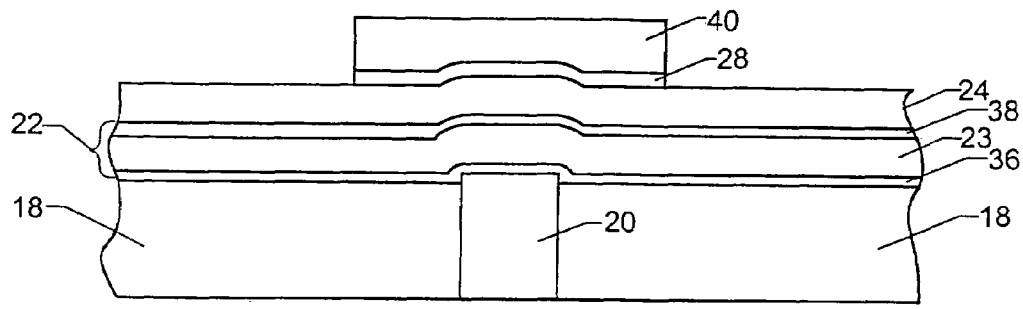
Figure 8C:
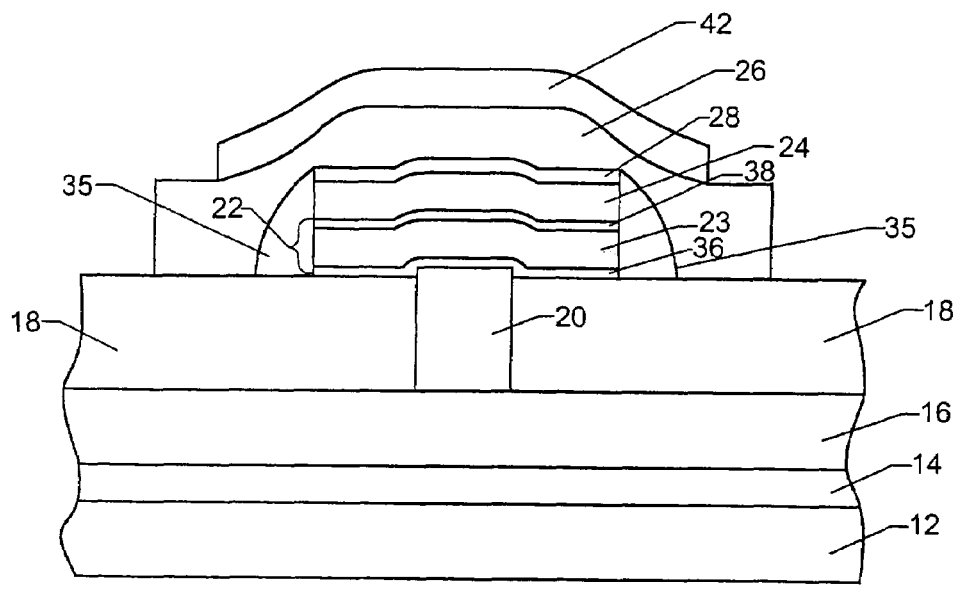

Referring now to FIGS. 8A through 8C, cross-sectional views show the structure of the antifuse 60 of FIGS. 4A and 4B existing at selected points in the fabrication process. The results of the processing steps are analogous to those shown in FIGS. 5A through 5C, but for a device such as shown in FIGS. 4A and 4B.

Referring now specifically to FIG. 8C, photoresist 40 has been removed using conventional mask-stripping steps and layers 24 through 36 have been etched and an insulating layer 35 is deposited over the layers 36, 22, 38, and 24 comprising the antifuse stack and the exposed surface of the insulating layer 18. Conventional masking and etching techniques (not shown) are then employed to form insulating layer 35 into spacers, shown in FIG. 8C. Next, metal interconnect layer 26 is deposited over spacers 35 and is electrically connected to barrier metal layer 24. A masking layer 42 may be formed over metal interconnect layer 26 using conventional photolithographic techniques in preparation for final processing. FIG. 4A depicts the structure of antifuse 60 in FIG. 8C after performance of further processing steps.

The use of amorphous carbon, amorphous carbon doped with at least one of hydrogen and fluorine, or amorphous silicon carbide, as the antifuse material layer in metal-to-metal antifuses inhibits the "healing" or "switching" by which the conductive filament deteriorates after programming.

Any of the above-described antifuses can be programmed using the following method.

In a first embodiment, a programming pulse of about 0.25 milliAmps (mA) to about 0.5 mA is applied to an antifuse in a first direction for about 10 microseconds (μs) to about 1 millisecond (ms). Next, a programming pulse of about 0.25 mA to about 0.5 mA is applied to the antifuse in a second direction for about 10 μs to about 1 millisecond (ms). This will form an antifuse link having a finite resistance of less than about 2000 ohms. To achieve an antifuse with a finite resistance of about 100 ohms to about 400 ohms, an additional soaking pulse of about 2 mA to about 5 mA is applied to the antifuse in a first direction for about 1 millisecond (ms)

to about 5 ms, and an additional soaking pulse of about 2 mA to about 5 mA is applied to the antifuse in a second direction for about 1 ms to about 5 ms. The sequence of soaking pulses may be repeated, for example, up to four more times.

In a second embodiment, a programming pulse of about 0.25 mA to about 0.5 mA is applied to an antifuse in a first direction for about 1 ms to about 5 ms. Next, a programming pulse of about 0.25 mA to about 0.5 mA is applied to the antifuse in a second direction for about 1 ms to about 5 ms. This sequence of programming pulses is repeated, for example, four more times to form an antifuse link having a finite resistance of less than about 2000 ohms. To achieve an antifuse with a finite resistance of about 100 ohms to about 400 ohms, an additional soaking pulse of about 2 mA to about 5 mA is applied to the antifuse in a first direction for about 1 ms to about 5 ms, and an additional soaking pulse of about 2 mA to about 5 mA is applied to the antifuse in a second direction for about 1 ms to about 5 ms. The sequence of soaking pulses may be repeated up to four more times.

One of the main advantages of metal-to-metal antifuses is that they may be disposed over an active region of a semiconductor substrate rather than in the active region. This provides for much greater circuit density in the active region of the substrate, however, programming an antifuse placed above the active region must be accomplished without damaging the circuits in the active region.

By programming the metal-to-metal antifuse according to the present invention, the amount of energy used in the programming process achieves a reduction in the heating of the aluminum metallization layer to minimize the likelihood that aluminum will migrate into the conductive links of the antifuse itself or damage the aluminum by melting or migrating the aluminum away from the antifuse and causing a disconnect in the interconnect aluminum line. This is a significant advantage over programming methods which address the read disturb problem by raising the magnitude of the programming current.

Antifuses according to the present invention are programmed using programming pulses of current that are substantially lower in both magnitude and duration than those of the prior art, and provide links of lower resistance and with less read disturb than amorphous silicon metal-to-metal antifuses. The antifuses can be programmed with current pulses of about 0.25 mA to about 0.5 mA for as short as about 10 μs to about 1 ms to achieve a very stable antifuse resistance of less than about 2000 ohms, and then soaked with current pulses of about 2 mA to about 5 mA to achieve a very stable antifuse resistance of about 100 to about 400 ohms. The reduction in programming current permits the use of smaller programming current transistors, which helps to reduce die size.

Referring again to FIG. 2A, an exemplary antifuse that is suitable for programming according to the present invention is depicted schematically in a cross-sectional view. It is believed that the present invention is also useful for programming other types of antifuses.

Figure 9:
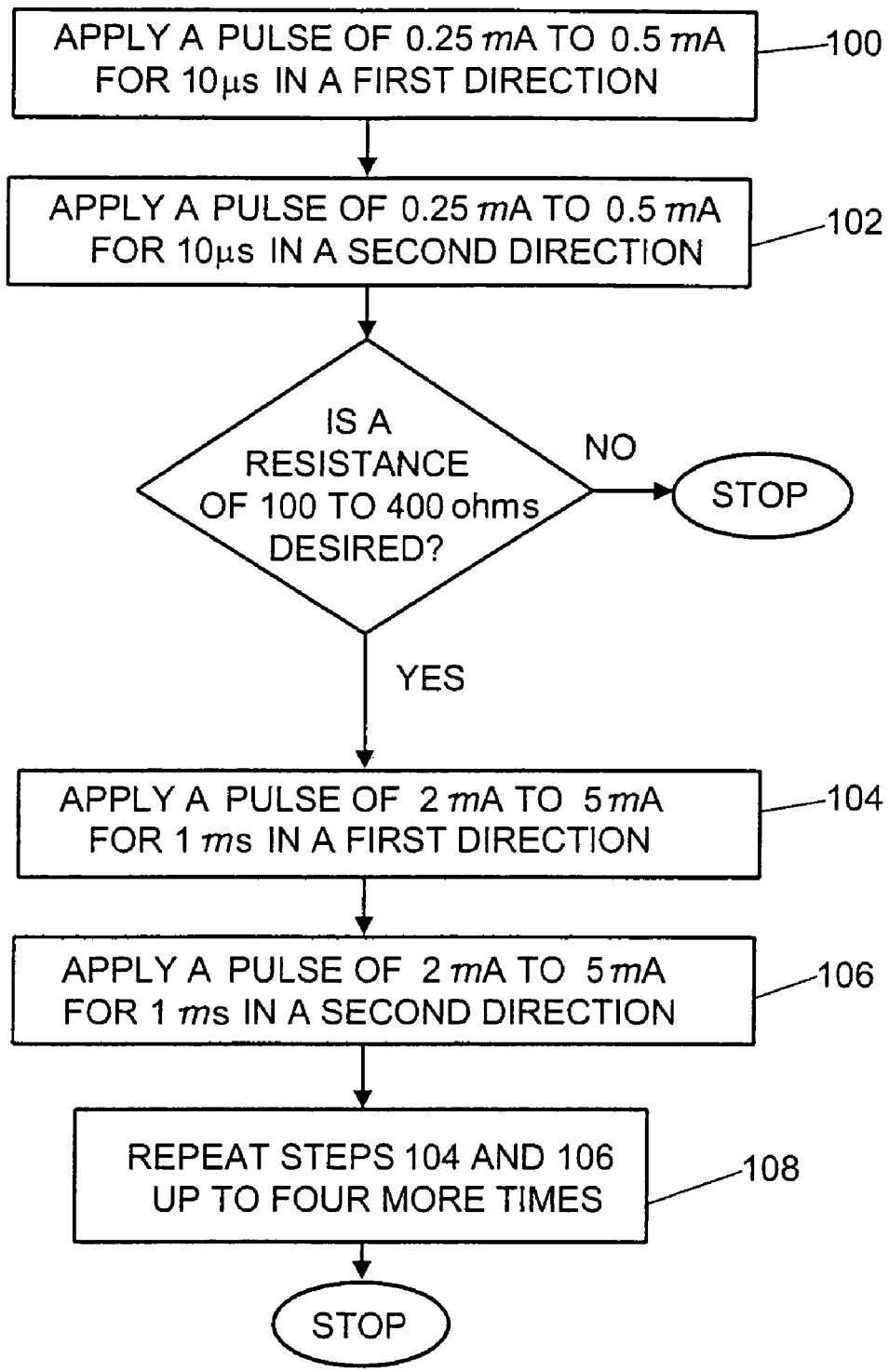
FIG. 9 is a flow diagram illustrating the steps of a first embodiment of antifuse programming.

FIG. 9 is a flow diagram illustrating the steps of a first embodiment. First, at programming Step 100, a pulse of about 0.25 mA to about 0.5 mA is applied to an antifuse in a first direction for about 10 μs to about 1 ms. Next, at programming Step 102, a pulse of about 0.25 mA to about 0.5 mA is applied to the antifuse in a second direction for about 10 μs to about 1 ms. For the type of antifuse illustrated in FIG. 2A, this has been shown to form an antifuse link having a finite resistance of less than about 2000 ohms. If an antifuse with a finite resistance of less than about 100 ohms to about 400 ohms is desired, at soaking Step 104, a pulse of about 2 mA to about 5 mA is applied to the antifuse in a first direction for about 1 ms to about 5 ms, and at soaking Step 106, a pulse of about 2 mA to about 5 mA is applied to the antifuse in a second direction for about 1 ms to about 5 ms. At soaking Step 108, the sequence of Steps 104 and 106 may be repeated (e.g., up to four more times). Repeating the sequence of soaking Steps 104 and 106 helps to reduce the distribution range of programmed antifuse resistances.

In the soaking Steps 104 and 106 for the fuse illustrated in FIG. 2A, when the pulses are about 2 mA, the fuse resistance has a range of about 100 ohms to about 400 ohms; when the pulses are about 3 mA, the fuse resistance has a range of about 100 ohms to about 300 ohms; and when the pulses are about 5 mA, the fuse resistance has a range of about 100 ohms to about 200 ohms. Applying pulses in Steps 104 and 106 of greater than about 6 mA may create an unstable state in the antifuse link.

Typically, antifuse resistance decreases with additional current stress, however, presently it has been found that the application of current in a range of about 7 mA to about 10 mA results in antifuses having a distribution of resistances which is greater than that for a 5 mA pulse. An increase in current beyond this range again causes a decrease in antifuse resistance.

It should be appreciated that about a 10 μs pulse width in comparison to about a 1 ms pulse width requires a programming voltage that is about 1 volt (V) to about 1.5 V greater than the breakdown voltage.

Figure 10:
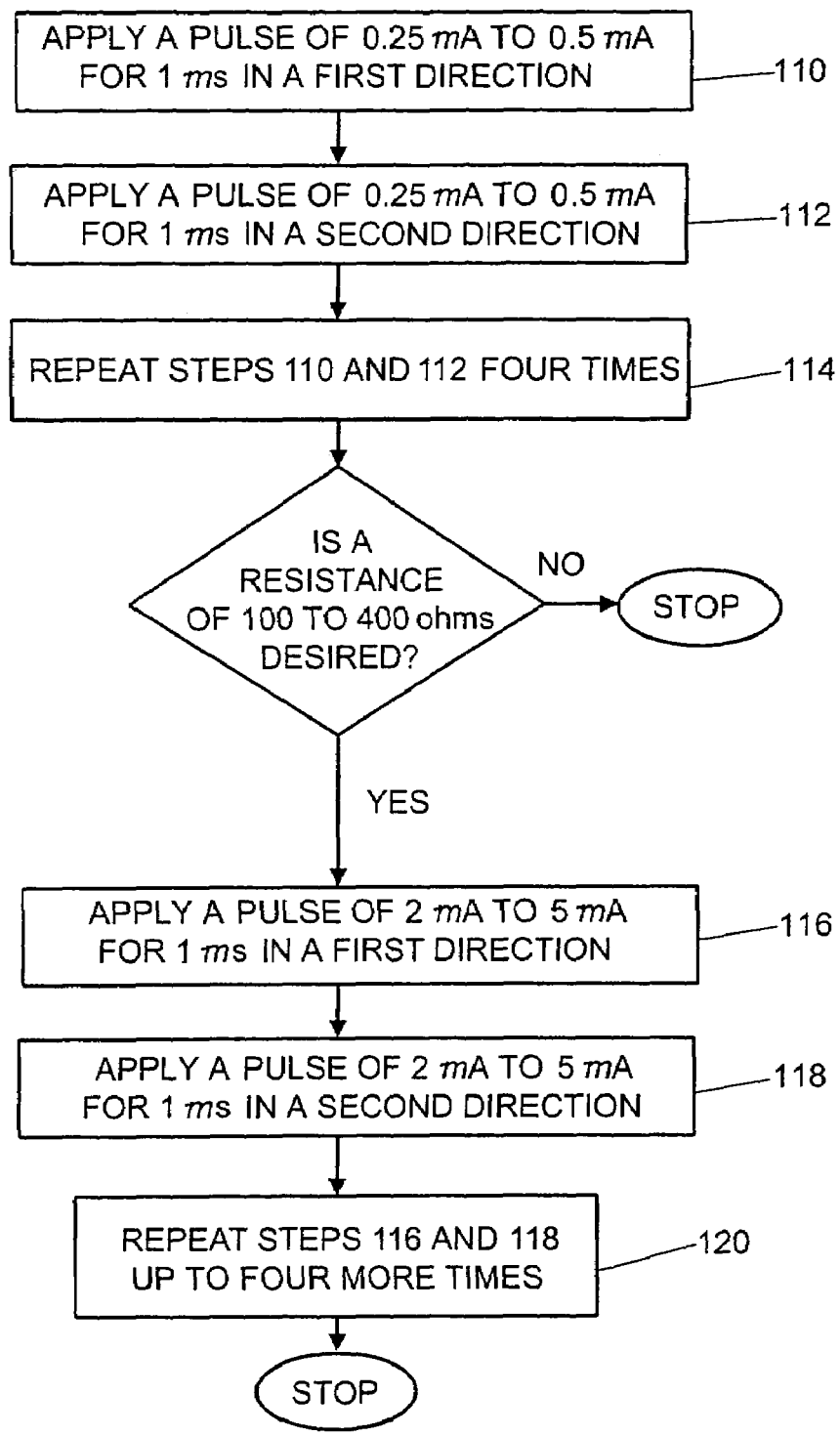
FIG. 10 is a flow diagram illustrating the steps of a second embodiment of antifuse programming.

FIG. 10 is a flow diagram illustrating the steps of a second embodiment. First, at programming Step 110, a pulse of about 0.25 mA to about 0.5 mA is applied to an antifuse in a first direction for about 1 ms to about 5 ms. Next, at programming Step 112, a pulse of about 0.25 mA to about 0.5 mA is applied to the antifuse in a second direction for about 1 ms to about 5 ms. At programming Step 114, the sequence of Steps 110 and 112 is repeated a desired number of times (e.g., up to four more times). For the antifuse illustrated in FIG. 2A, this will form an antifuse link having a finite resistance of less than about 2000 ohms. If an antifuse with a finite resistance of about 100 ohms to about 400 ohms is desired, at Step 116, a pulse of about 2 mA to about 5 mA is applied to the antifuse in a first direction for about 1 ms to about 5 ms, and at Step 118, a pulse of about 2 mA to about 5 mA is applied to the antifuse in a second direction for about 1 ms to about 5 ms. At Step 120, the sequence of Steps 116 and 118 may be repeated up to four more times. Repeating the sequence of Steps 116 and 118 helps to reduce the distribution range of programmed antifuse resistances.

In the first and second embodiments, the methods include a first low programming current of about 0.25 mA to about 0.5 mA followed by a higher soaking current of about 2 mA to about 5 mA. The method of generally using a low programming current followed by higher soaking current provides a relatively lower and tighter distribution of antifuse resistance than a high programming current of about 2 mA to about 5 mA followed by a high soaking current of about 2 mA to about 5 mA.

According to the present invention, current pulses of a particular duration and magnitude are applied to the electrodes of an antifuse during the programming process. In an integrated circuit die, the antifuses are not directly accessible from outside of the integrated circuit. The antifuses in the integrated circuit are selected for programming and accessed by a number of known schemes, which generally include first providing the integrated circuit with information identifying the antifuse to be programmed. This information is transformed by circuitry in the integrated circuit into signals, which provide a programming path to the antifuse to be programmed.

In the programming set-up, a programming path from input/output (I/O) pins of the integrated circuit to the antifuse is created by addressing circuitry. Selection circuitry is connected via I/O pins to addressing circuitry located in the integrated circuit. This programming path includes MOS transistors that are turned on by addressing circuitry to complete the programming path from a programming pulse generator to antifuse. Those of ordinary skill in the art will recognize that the programming set-up described is oversimplified for the purpose of showing the environment of the present invention without overcomplicating the disclosure. Such skilled persons are familiar with addressing programmable devices and will have no trouble comprehending the invention from the disclosure herein.

The programming device is connected to I/O pins of the integrated circuit to complete the programming path to its internal antifuses. Details of product use vary by manufacturer, but those of ordinary skill in the art recognize that full information on the use of such devices is provided by the manufacturers. It should be appreciated that providing the apparatus for providing such programming pulses is well within the level of skill of those of ordinary skill in that particular art. Accordingly, a detailed description of the apparatus for proving the pulses according to the method of the present invention is not described herein. A programming device suitable for use includes an antifuse programming system, such as Activator or Sculptor, available from Actel Corporation of California.

Figure 11:
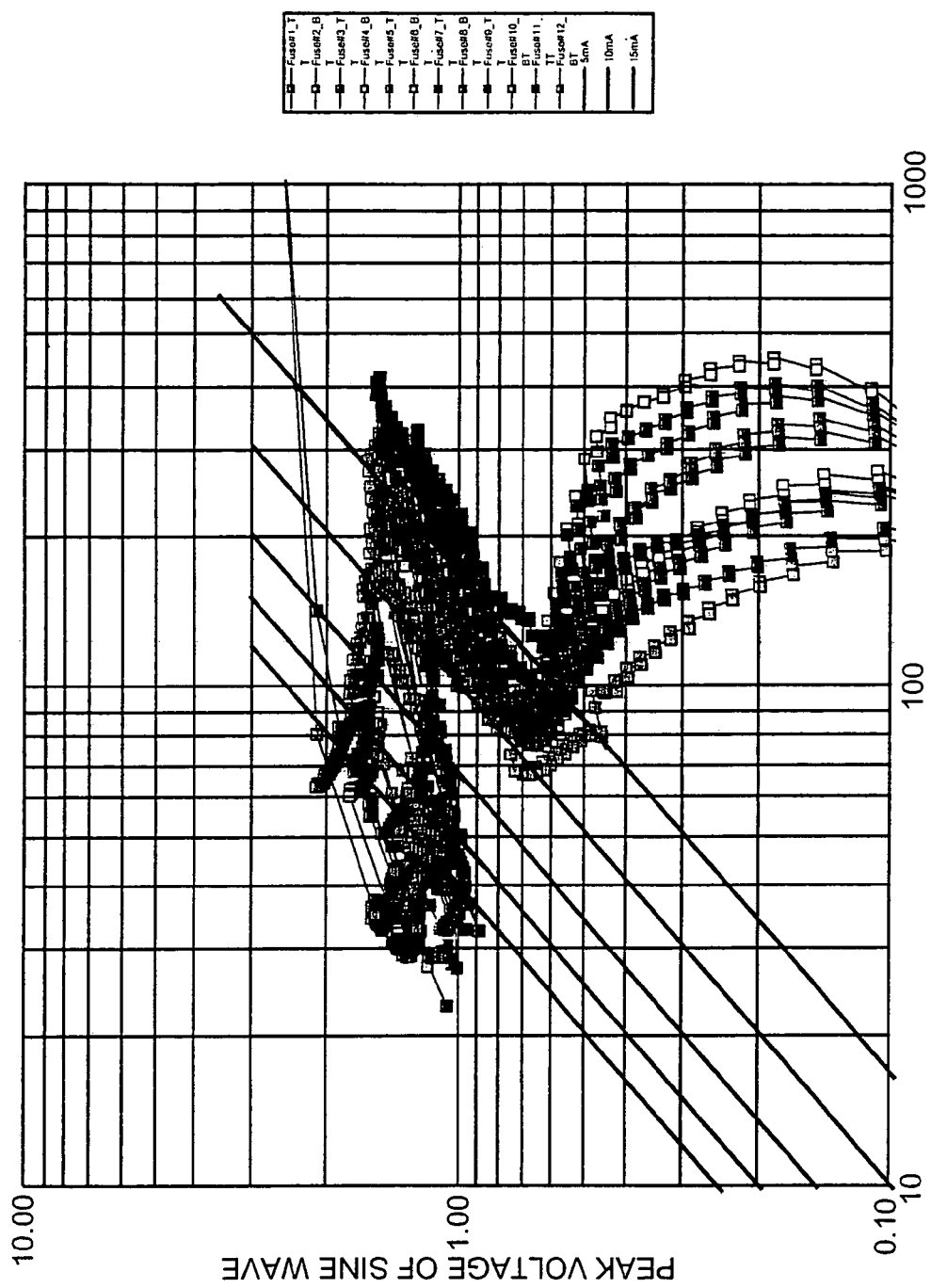
FIG. 11 is a graph illustrating the switching ratio of amorphous carbon having TiN as barrier metal layers in a prior art antifuse.

FIG. 11 is a graph illustrating the switching ratio of amorphous carbon having TiN as barrier metal layers. FIG. 11 illustrates a resistance test of antifuse constructed of an antifuse layer (SiC, amorphous carbon, SiC) having an upper and a lower barrier metal layer of TiN. The graph illustrates that an antifuse having an amorphous carbon antifuse layer with a TiN barrier metal layer at programming current of 0.5 mA has an on-state resistance of below about 1,000 ohms and the resistance drifts between about 6 to about 10 mA.

Figure 12:
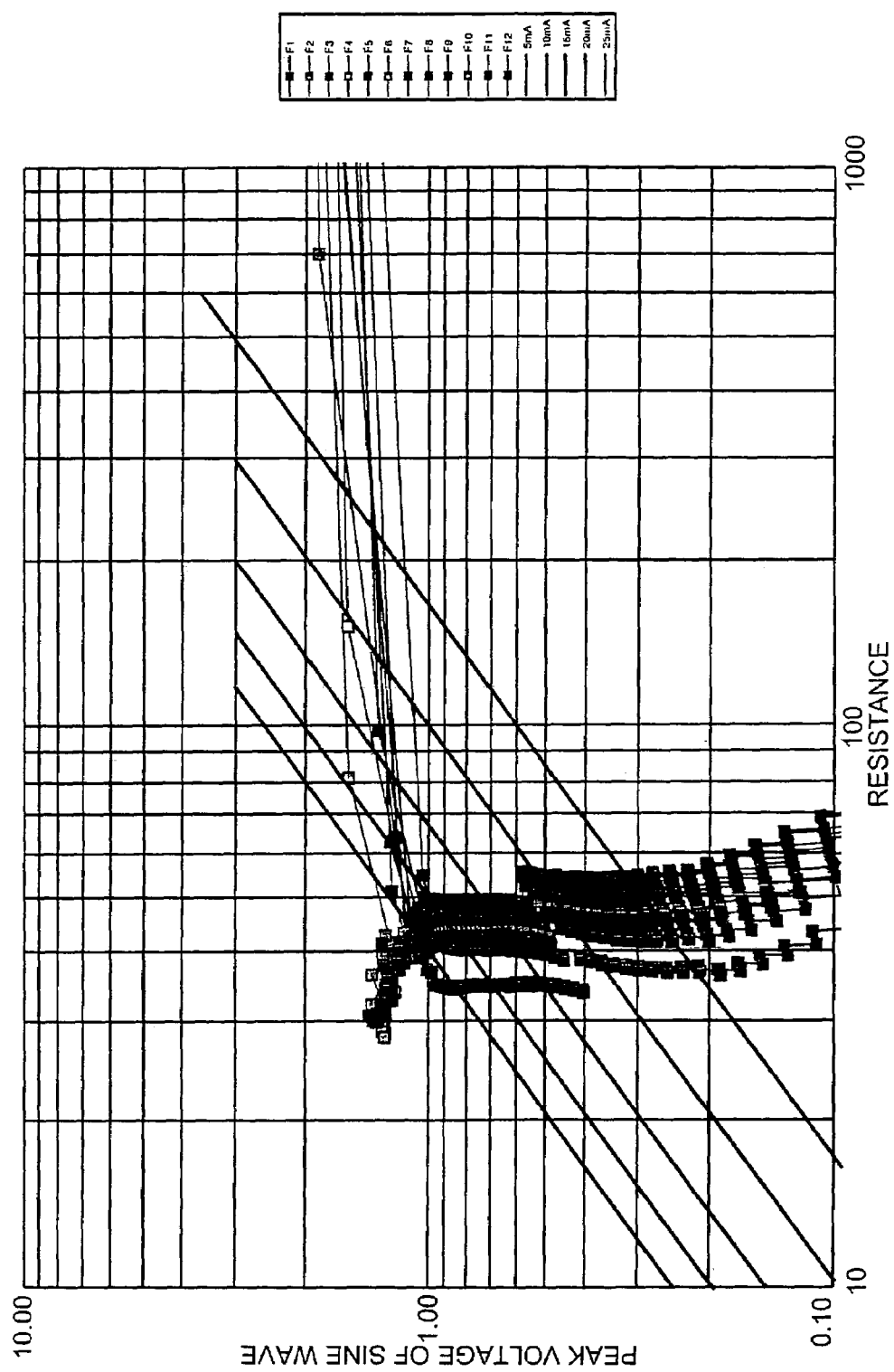
FIG. 12 is a graph illustrating the switching ratio of amorphous carbon having Ta as barrier metal layers.

In contrast to FIG. 11, FIG. 12 represents antifuses created according to the present invention. FIG. 12 is a graph illustrating the switching ratio of amorphous carbon sandwich having Ta as barrier metal layers. FIG. 12 illustrates the switching characteristics of antifuses constructed of an antifuse layer (SiC, amorphous carbon, SiC) having an upper and lower barrier metal layer of Ta. The graph illustrates, when compared to FIG. 11, that an antifuse having an amorphous carbon sandwich with barrier metal layers of Ta exhibits a lower resistance and has superior switching characteristics.

Figure 13:
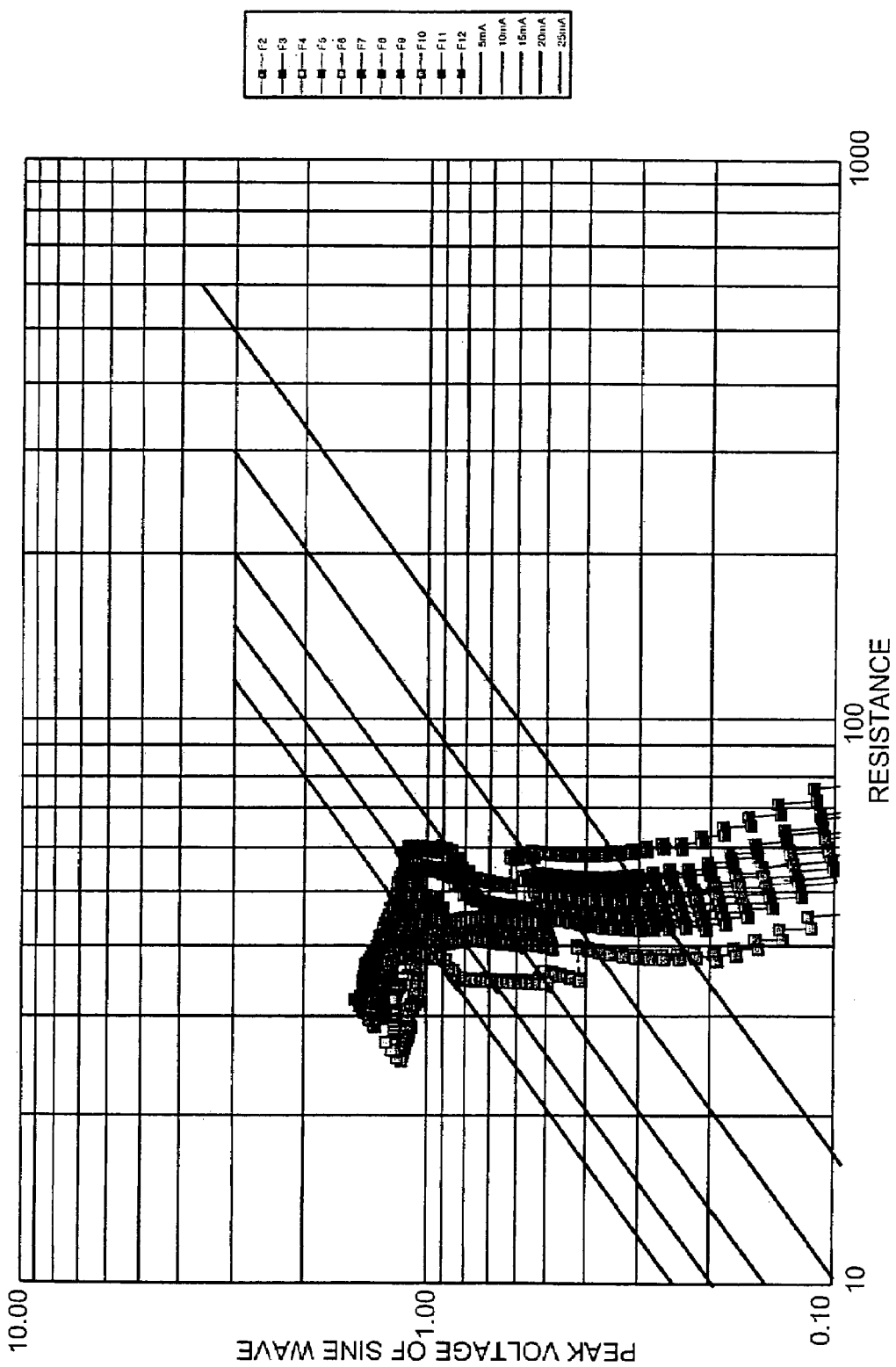
FIG. 13 is a graph illustrating the switching ratio of amorphous silicon having TaN as barrier metal layers.

Further in contrast to FIG. 11, FIG. 13 also represents antifuses created according to the present invention. FIG. 13 is a graph illustrating the switching ratio of amorphous carbon sandwich having TaN as barrier metal layers. FIG. 13 illustrates the switching characteristics of antifuse constructed of an antifuse layer (SiC, amorphous carbon, SiC) having an upper and lower barrier metal layer of TaN. The graph illustrates, when compared to FIG. 11, that an antifuse having an amorphous carbon sandwich with barrier metal layers of TaN exhibits a lower resistance and has superior switching characteristics.

When compared to the antifuse of FIG. 11, an antifuse having a Ta or TaN barrier metal layer with an amorphous carbon antifuse layer exhibits a decrease in resistance by about one order of magnitude at a programming current of about 0.5 mA. Thus, the resistance decreases below 200 ohms or a magnitude of 10.

In addition to the reduction in resistance, an antifuse according to the preferred embodiment that has been programmed at a low current (i.e., below about 0.5 mA) will not switch off until the device is operating at about 25 mA and above.

Also, using TiN as a barrier metal layer is not a good candidate for copper metallization due to the problem of copper intrusion into the antifuse layer. The use of Ta or TaN as a barrier metal layer prevents copper intrusion into the antifuse layer.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for programming an antifuse comprising:
applying a first programming pulse of about 0.25 mA to about 0.5 mA to a first electrode of the antifuse, said antifuse comprising:
a tungsten plug disposed in a via in an insulating layer disposed above and in electrical contact with a lower metal interconnect layer forming a first electrode;
an antifuse layer disposed above an upper surface of said tungsten plug, said antifuse layer comprising a lower adhesion-promoting layer, a middle layer comprising amorphous carbon, and an upper adhesion-promoting layer; and
a layer of a barrier metal disposed over said antifuse layer forming a second electrode, said barrier metal comprising a material selected from a group consisting of at least one of tantalum and tantalum nitride; and
applying a second programming pulse of about 0.25 mA to about 0.5 mA to said second electrode of the antifuse.

2. The method of claim 1, wherein said first programming pulse and said second programming pulse are each applied for about 10 µs.

3. The method of claim 1, further comprising:
applying a first soaking pulse of about 2 mA to about 5 mA to said first electrode; and
applying a second soaking pulse of about 2 mA to about 5 mA to said second electrode; and
repeating applying said first soaking pulse and applying said second soaking pulse.

4. The method of claim 3, wherein said first programming pulse and said second programming pulse are applied for about 10 µs, and said first soaking pulse and said second soaking pulse are applied for about 1 ms.

5. The method of claim 1, wherein said applying said first programming pulse and said applying said second programming pulse are repeated at least four more times.

6. The method of claim 5, wherein said first programming pulse and said second programming pulse are applied for about 1 ms.

7. The method of claim 5, further comprising:
applying a first soaking pulse of about 2 mA to about 5 mA to said first electrode;
applying a second soaking pulse of about 2 mA to about 5 mA to said second electrode; and repeating said applying said first soaking pulse and said applying said second soaking pulse.

8. The method of claim 7, wherein said first programming pulse and said second programming pulse are applied for about 1 ms, and said first soaking pulse and said second soaking pulse are applied for about 1 ms.

9. A method for programming an antifuse comprising:
applying a first programming pulse of about 0.25 mA to about 0.5 mA to a first electrode of the antifuse, said antifuse comprising:
a tungsten plug disposed in a via in an insulating layer disposed above and in electrical contact with a lower metal interconnect layer;
a first layer of a barrier metal disposed above and in electrical contact with said tungsten plug forming a first electrode, said first layer of said barrier metal comprising a material selected from a group consisting of at least one of tantalum and tantalum nitride;
an antifuse layer disposed above an upper surface of said tungsten plug, said antifuse layer comprising a lower adhesion-promoting layer, a middle layer comprising amorphous carbon, and an upper adhesion-promoting layer;
a second layer of a barrier metal disposed over said antifuse layer forming a second electrode, said second layer of said barrier metal comprising a material selected from a group consisting of at least one of tantalum and tantalum nitride; and
a second insulating layer disposed over said first insulating layer, said antifuse layer, said first layer of said barrier metal, and said second layer of said barrier metal; and
applying a second programming pulse of about 0.25 mA to about 0.5 mA to said second electrode of the antifuse.

10. The method of claim 9, wherein said first programming pulse and said second programming pulse are each applied for about 10 μs.

11. The method of claim 9, further comprising:
applying a first soaking pulse of about 2 mA to about 5 mA to said first electrode;
applying a second soaking pulse of about 2 mA to about 5 mA to said second electrode; and
repeating applying said first soaking pulse and applying said second soaking pulse.

12. The method of claim 11, wherein said first programming pulse and said second programming pulse are applied for about 10 μs, and said first soaking pulse and said second soaking pulse are applied for about 1 ms.

13. The method of claim 9, wherein said applying said first programming pulse and said applying said second programming pulse are repeated at least four more times.

14. The method of claim 13, wherein said first programming pulse and said second programming pulse are applied for about 1 ms.

15. The method of claim 13, further comprising:
applying a first soaking pulse of about 2 mA to about 5 mA to said first electrode;
applying a second soaking pulse of about 2 mA to about 5 mA to said second electrode; and
repeating said applying said first soaking pulse and said applying said second soaking pulse.

16. The method of claim 15, wherein said first programming pulse and said second programming pulse are applied for about 1 ms, and said first soaking pulse and said second soaking pulse are applied for about 1 ms.

17. A method for programming an antifuse comprising:
applying a first programming pulse of about 0.25 mA to about 0.5 mA to a first electrode of the antifuse, said antifuse comprising:
a first layer of a barrier metal disposed on a surface forming a first electrode, said first layer of said barrier metal comprising a material selected from a group consisting of at least one of tantalum and tantalum nitride;
an antifuse layer disposed on said first layer of said barrier metal comprising a lower adhesion-promoting layer, a middle layer comprising amorphous carbon, and an upper adhesion-promoting layer; and
a second layer of a barrier metal disposed over said antifuse layer forming a second electrode, said second layer of said barrier metal comprising a material selected from a group consisting of at least one of tantalum and tantalum nitride; and
applying a second programming pulse of about 0.25 mA to about 0.5 mA to said second electrode of the antifuse.

18. The method of claim 17, wherein said first programming pulse and said second programming pulse are each applied for about 10 μs.

19. The method of claim 17, further comprising:
applying a first soaking pulse of about 2 mA to about 5 mA to said first electrode;
applying a second soaking pulse of about 2 mA to about 5 mA to said second electrode; and
repeating applying said first soaking pulse and applying said second soaking pulse.

20. The method of claim 19, wherein said first programming pulse and said second programming pulse are applied for about 10 μs, and said first soaking pulse and said second soaking pulse are applied for about 1 ms.

21. The method of claim 17, wherein said applying said first programming pulse and said applying said second programming pulse are repeated at least four more times.

22. The method of claim 21, wherein said first programming pulse and said second programming pulse are applied for about 1 ms.

23. The method of claim 21, further comprising:
applying a first soaking pulse of about 2 mA to about 5 mA to said first electrode;
applying a second soaking pulse of about 2 mA to about 5 mA to said second electrode; and
repeating said applying said first soaking pulse and said applying said second soaking pulse.

24. The method of claim 23, wherein said first programming pulse and said second programming pulse are applied for about 1 ms, and said first soaking pulse and said second soaking pulse are applied for about 1 ms.

25. A method for programming an antifuse comprising:
applying a first low current programming pulse to a first electrode of the antifuse, said antifuse comprising:
a tungsten plug disposed in a via in an insulating layer disposed above and in electrical contact with a lower metal interconnect layer;
a first layer of a barrier metal disposed above and in electrical contact with said tungsten plug forming a first electrode, said first layer of said barrier metal comprising a material selected from a group consisting of at least one of tantalum and tantalum nitride;
an antifuse layer disposed above an upper surface of said tungsten plug, said antifuse layer comprising a lower adhesion-promoting layer, a middle layer comprising amorphous carbon, and an upper adhesion-promoting layer;

a second layer of a barrier metal disposed over said antifuse layer forming a second electrode, said second layer of said barrier metal comprising a material selected from a group consisting of at least one of tantalum and tantalum nitride; and a second insulating layer disposed over said first insulating layer, said antifuse layer, said first layer of said barrier metal, and said second layer of said barrier metal;

applying a second low current programming pulse to said second electrode;

applying a first high current soaking pulse to said first electrode; and applying a second high current soaking pulse to said second electrode.

26. A method for programming an antifuse comprising:

applying a first low current programming pulse to a first electrode of the antifuse, said antifuse comprising:

a tungsten plug disposed in a via in an insulating layer disposed above and in electrical contact with a lower metal interconnect layer;

a first layer of a barrier metal disposed above and in electrical contact with said tungsten plug forming a first electrode, said first layer of said barrier metal comprising a material selected from a group consisting of at least one of tantalum and tantalum nitride;

an antifuse layer disposed above an upper surface of said tungsten plug, said antifuse layer comprising a lower adhesion-promoting layer, a middle layer comprising amorphous carbon, and an upper adhesion-promoting layer;

a second layer of a barrier metal disposed over said antifuse layer forming a second electrode, said second layer of said barrier metal comprising a material selected from a group consisting of at least one of tantalum and tantalum nitride; and a second insulating layer disposed over said first insulating layer, said antifuse layer, said first layer of said barrier metal, and said second layer of said barrier metal;

applying a second low current programming pulse to said second electrode;

applying a first high current soaking pulse to said first electrode; and applying a second high current soaking pulse to said second electrode.

27. A method for programming an antifuse comprising:

applying a first low current programming pulse to a first electrode of the antifuse, said antifuse comprising:

a first layer of a barrier metal disposed on a surface forming a first electrode, said first layer of said barrier metal comprising a material selected from a group consisting of at least one of tantalum and tantalum nitride;

an antifuse layer disposed on said first layer of said barrier metal comprising a lower adhesion-promoting layer, a middle layer comprising amorphous carbon, and an upper adhesion-promoting layer; and a second layer of a barrier metal disposed over said antifuse layer forming a second electrode, said second layer of said barrier metal comprising a material selected from a group consisting of at least one of tantalum and tantalum nitride;

applying a second low current programming pulse to said second electrode;

applying a first high current soaking pulse to said first electrode; and applying a second high current soaking pulse to said second electrode.

* * * * *